United States Patent [19]

Sakaguchi

[11] 4,454,467
[45] Jun. 12, 1984

[54] REFERENCE VOLTAGE GENERATOR

[75] Inventor: Jiroh Sakaguchi, Hino, Japan

[73] Assignee: Hitachi, Ltd., Tokyo, Japan

[21] Appl. No.: 399,901

[22] Filed: Jul. 19, 1982

[30] Foreign Application Priority Data

Jul. 31, 1981 [JP] Japan .................... 56-119072

[51] Int. Cl.³ .............................................. G05F 3/08
[52] U.S. Cl. ..................... 323/313; 307/304; 323/315
[58] Field of Search ............... 323/313–316, 323/907; 307/296 R, 297, 304

[56] References Cited

U.S. PATENT DOCUMENTS

| | | | |
|---|---|---|---|
| 4,068,140 | 1/1978 | Lou | 307/304 |
| 4,096,430 | 6/1978 | Waldron | 307/304 |
| 4,347,476 | 8/1982 | Tam | 323/313 |

FOREIGN PATENT DOCUMENTS

| | | | |
|---|---|---|---|
| 2708022 | 8/1978 | Fed. Rep. of Germany . | |
| 132753 | 10/1979 | Japan | 323/313 |
| 2044530 | 10/1980 | United Kingdom . | |
| 2070820 | 9/1981 | United Kingdom . | |
| 2090442 | 7/1982 | United Kingdom . | |

OTHER PUBLICATIONS

Oguey et al., "MOS Voltage Reference Based on Polysilicon Gate Work Function Difference", IEEE Journal of Solid-State Ckts., vol. SC-15, No. 3, Jun. 1980.

Primary Examiner—William H. Beha, Jr.
Attorney, Agent, or Firm—Antonelli, Terry & Wands

[57] ABSTRACT

A reference voltage generator includes a first n-channel MISFET which has a p+-type polycrystalline silicon gate electrode, and second and third n-channel MISFETs which have n+-type polycrystalline silicon gate electrodes. The first MISFET has its gate and source coupled in common. The second MISFET has its gate coupled to the drain of the first MISFET, and has its source coupled to an output terminal. The third MISFET is supplied across its gate and source with a voltage which is delivered to the output terminal. First and second bias currents to be supplied to the first and second MISFETs respectively are made levels proportional to the drain current of the third MISFET. As a result, the output voltage of the output terminal is made a level which is substantially in agreement with the difference between the threshold voltages of the first and second MISFETs. The output voltage of this circuit is allowed to exhibit favorable temperature characteristics by properly setting the ratio of the first bias current and the second bias current.

18 Claims, 16 Drawing Figures

REFERENCE VOLTAGE GENERATOR

BACKGROUND OF THE INVENTION

This invention relates to a reference voltage generator which is constructed of MISFETs (insulated gate type field effect transistors).

Two MISFETs whose gate electrodes are made of materials having work functions different from each other exhibit threshold voltages different from each other. The difference between the threshold voltages of the two MISFETs becomes equal to the difference of the work functions of the gate electrodes in the respective MISFETs. The threshold voltage difference can be utilized as a reference voltage. Since the reference voltage thus obtained has its value determined by the work function difference of the two gate electrodes, it is less liable to evil effects attributed to dispersions in the characteristics of the circuit elements.

Accordingly, when fabricated in the form of an integrated circuit, a reference voltage generator utilizing the work function difference produces a reference voltage of comparatively precise value in spite of comparatively great dispersions in the characteristics of various circuit elements in the integrated circuit.

The inventor's researches, however, have revealed that the reference voltage exhibits a temperature dependence and a supply voltage dependence which are not negligible.

SUMMARY OF THE INVENTION

It is accordingly an object of this invention to provide a reference voltage generator which produces a reference voltage of stable level irrespective of temperature fluctuations.

Another object of this invention is to provide a reference voltage generator which produces a reference voltage of stable level irrespective of fluctuations in a supply voltage.

Another object of this invention is to provide a reference voltage generator which includes a small number of circuit elements.

Another object of this invention is to provide a reference voltage generator which is suited to be fabricated in the form of a CMOS (complementary metal oxide semiconductor) integrated circuit.

Further objects of this invention will become apparent from the following description taken in conjunction with the drawings.

DETAILED DESCRIPTION OF THE EMBODIMENTS

Figure 1:
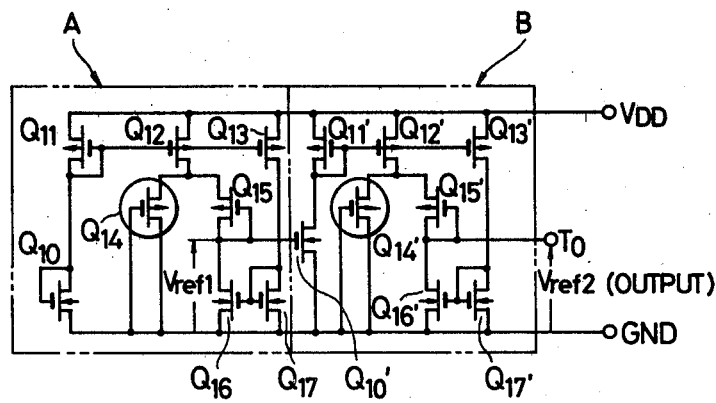
FIG. 1 is a circuit diagram of a reference voltage generator proposed prior to this invention by the inventor.

Prior to the present invention, the inventor proposed a reference voltage generator of an arrangement as shown in FIG. 1.

The reference voltage generator is constructed of a circuit B which delivers a reference voltage $V_{ref2}$, and a circuit A which delivers a bias voltage $V_{ref1}$ to be supplied to the circuit B.

In the circuit B, a pair of p-channel type MISFETs $Q_{14}'$ and $Q_{15}'$ have their gate electrodes made of polycrystalline silicon layers of conductivity types opposite to each other. That is, the MISFET $Q_{14}'$ has its gate electrode made of an n-type polycrystalline silicon layer, while the MISFET $Q_{15}'$ has its gate electrode made of a p-type polycrystalline silicon layer.

Owing to the circuit connections as shown in the figure, the reference voltage $V_{ref2}$ to be delivered from the circuit B is made a value close to the difference $(V_{th1}-V_{th2})$ between the threshold voltage $V_{th1}$ of the MISFET $Q_{14}'$ and the threshold voltage $V_{th2}$ of the MISFET $Q_{15}'$. Since the threshold voltage difference $(V_{th1}-V_{th2})$ becomes equal to the difference between the Fermi level of the n-type polycrystalline silicon layer and that of the p-type polycrystalline silicon layer, the reference voltage $V_{ref2}$ becomes a value close to the Fermi level difference between the n-type polycrystalline silicon layer and the p-type polycrystalline silicon layer. In a case where a conductivity type-determining impurity in each of the n-type polycrystalline silicon layer and the p-type polycrystalline silicon layer is at a high density of, for example, $10^{18}$ atoms/cm$^3$ or above, the Fermi level difference becomes a value close to the band gap of silicon. The reference voltage $V_{ref2}$ accordingly becomes a value close to the band gap of silicon.

In the illustrated reference voltage generator, the output voltage $V_{ref2}$ is stabilized irrespective of temperature fluctuations and supply voltage fluctuations as will be explained below.

The band gap of silicon has a temperature dependence. The physics of semiconductors is explained considerably minutely in many literatures. As one literature, there can be mentioned "Physics of Semiconductor Devices" by S. M. SZE, published by John Wiley & Sons in 1969, especially Chapter 2 "Physics and Properties of Semiconductors", pp. 11–65.

Figure 2:
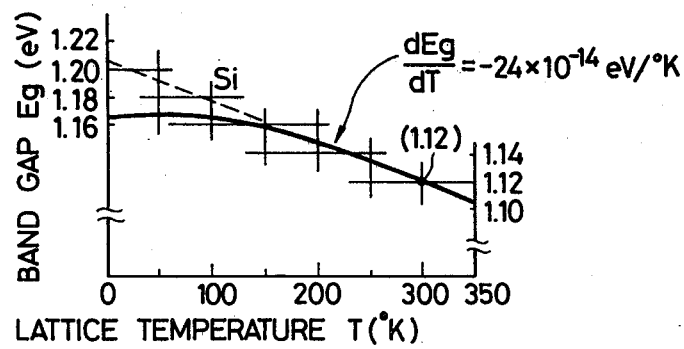
FIG. 2 is a diagram showing the energy gap $E_g$ of silicon and the temperature dependence thereof.

Page 24 of the literature indicates the relationships of several semiconductors between the band gap $E_g$ and the temperature, and FIG. 2 reproduces the relationship of silicon therefrom.

Figure 3:
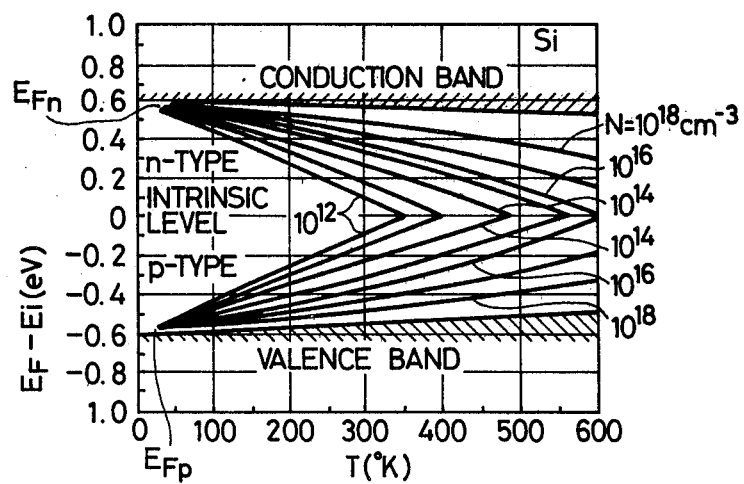
FIG. 3 is a diagram showing the temperature characteristics of the Fermi levels of n-type silicon and p-type silicon with impurity densities as parameters.

Likewise, the Fermi level of n-type silicon and that of p-type silicon have temperature dependences. FIG. 3 illustrates the relationships between the Fermi level and the temperature, of n-type and p-type silicon materials at various impurity densities.

As understood by referring to FIGS. 2 and 3, the threshold voltage difference $(V_{th1}-V_{th2})$ between the MISFETs $Q_{14}'$ and $Q_{15}'$ shown in FIG. 1 involves the temperature dependence, and its value decreases with rise in temperature.

In the voltage generator of FIG. 1, therefore, the operation current of the MISFET $Q_{14}'$ and that of the MISFET $Q_{15}'$ are properly unbalanced in order that a substantial temperature compensation voltage may be generated by the MISFETS $Q_{14}'$ and $Q_{15}'$. The current ratio between the operating current of the MISFET $Q_{14}'$ and that of the MISFET $Q_{15}'$ is set at an appropriate value by properly setting the sizes of MISFETs $Q_{11}'-Q_{13}'$ constituting a current mirror circuit and by properly setting the sizes of MISFETs $Q_{16}'$ and $Q_{17}'$ constituting another current mirror circuit.

The reference voltage generator shown in FIG. 1 is also provided with a circuit similar to the circuit B, that is, the circuit A constructed of MISFETs $Q_{10}-Q_{17}$, in order to reduce the supply voltage dependences of the input currents of the current mirror circuits constructed of the MISFETs $Q_{11}'$, $Q_{12}'$ etc. In the circuit A, the operating currents of the MISFETs $Q_{14}$ and $Q_{15}$ are equalized. Since the operating currents of the p-channel type MISFET $Q_{14}$ with a gate electrode made of an n-type polycrystalline silicon layer and the p-channel type MISFET $Q_{15}$ with a gate electrode made of a p-type polycrystalline silicon layer are made equal to each other, the output voltage $V_{ref1}$ of the circuit A consequently becomes a constant value unaffected by fluctuations in bias currents even when the bias currents which are delivered from the MISFETs $Q_{12}$ and $Q_{13}$ in the circuit A have fluctuated due to the fluctuation of a supply voltage $V_{DD}$. That is, the output voltage $V_{ref1}$ becomes a value equal to the difference between the Fermi levels of n-type silicon and p-type silicon. Since an n-channel type MISFET $Q_{10}'$ in the circuit B is supplied with the constant bias voltage $V_{ref1}$ across the gate and source thereof, it produces a constant drain current which is not affected by the fluctuation of the supply voltage $V_{DD}$. It was conjectured that bias currents to be delivered from the drains of the MISFETs $Q_{12}'$ and $Q_{13}'$ in response to the aforementioned drain current would have no supply voltage dependence. It was consequently conjectured that the voltage $V_{ref2}$ to be delivered from the circuit B would have no supply voltage dependence.

The illustrated reference voltage generator, however, requires a large number of circuit constituent elements because it is constructed of the two circuits of the arrangements similar to each other, i.e., the circuit A for stabilizing the bias currents irrespective of the supply voltage fluctuations and the circuit B for determining the output voltage $V_{ref2}$ and effecting the temperature compensation thereof. Moreover, the inventor's experiment has revealed that, in spite of the temperature compensation, the output voltage - versus - temperature characteristic of the reference voltage generator is somewhat curved upwardly as indicated by a characteristic curve $L_1$ in FIG. 9 by way of example. In other words, it was difficult to satisfactorily temperature-compensate the output voltage $V_{ref2}$ in a wide temperature range.

In accordance with this invention, there is provided a reference voltage generator which has a comparatively small number of circuit elements and whose temperature compensation is satisfactorily effected in a wide temperature range.

In accordance with this invention, the first one of a pair of MISFETs endowed with threshold voltages different from each other is diode-connected. The second one of the pair of MISFETs constructs a source follower circuit which receives the drain voltage of the first MISFET. The source of the second MISFET accordingly delivers a voltage of a level corresponding to the threshold voltage difference between the first MISFET and the second MISFET. A proper bias circuit for applying bias currents to the first and second MISFETs is prepared. The bias circuit includes a MISFET which receives across its gate and source the voltage delivered from the source of the second MISFET. The bias currents to be supplied to the first and second MISFETs are determined by the MISFET in the bias circuit. Since the MISFET in the bias circuit has an appropriate threshold voltage - versus - temperature characteristic, the threshold voltage difference between the first and second MISFETs or the voltage to be delivered from the source of the second MISFET is temperature-compensated.

Figure 4:
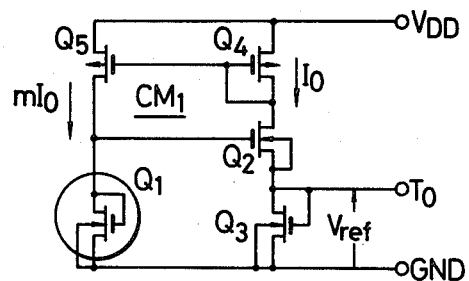
FIG. 4 is a circuit diagram of a reference voltage generator which is an embodiment of this invention.

FIG. 4 shows a circuit diagram of a reference voltage generator which is an embodiment of this invention. In this embodiment, though no special restriction is intended, p-channel MISFETs and n-channel MISFETs constitute complementary circuits, and they are formed on a single silicon chip by the known CMOS IC technology as employs the polycrystalline silicon self-alignment technique.

A polycrystalline silicon layer which serves as the gate electrode of an n-channel MISFET $Q_1$ has its major part made the $p^+$-conductivity type. A polycrystalline silicon layer which serves as the gate electrodes of n-channel MISFETs $Q_2$ and $Q_3$ is made the $n^+$-conductivity type similarly to the gate electrode of an ordinary n-channel MISFET which is manufactured by the known polycrystalline silicon self-alignment technique. The gate electrodes of p-channel MISFETs $Q_4$ and $Q_5$ are made of a polycrystalline silicon layer of the $p^+$-conductivity type.

The MISFET, such as MISFET $Q_1$, the gate electrode of which is made the opposite conductivity type to the channel conductivity type thereof is enclosed with a circle. Since the other usual MISFETs are not enclosed with circles, they are distinguished from the abovestated MISFET such as MISFET $Q_1$. The same notation is adopted in circuit diagrams of further embodiments to be described later.

Figure 5A:
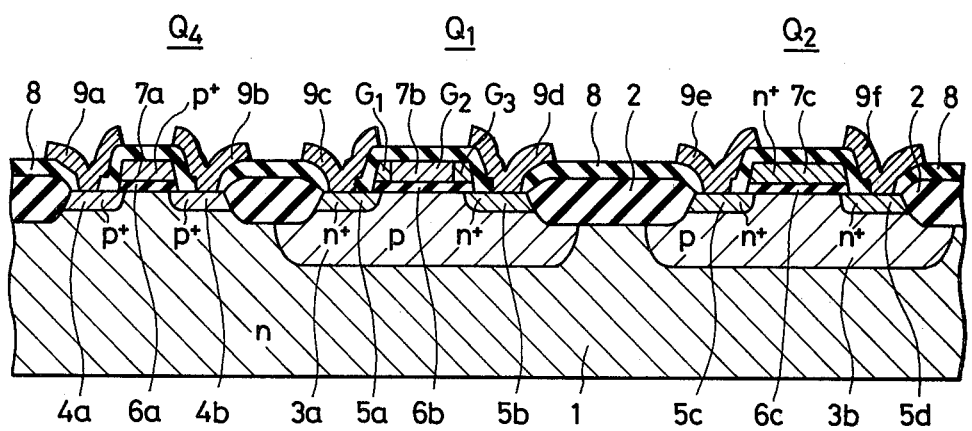
FIGS. 5A and 5B are sectional views of a fraction of a CMOS IC.
Figure 5B:
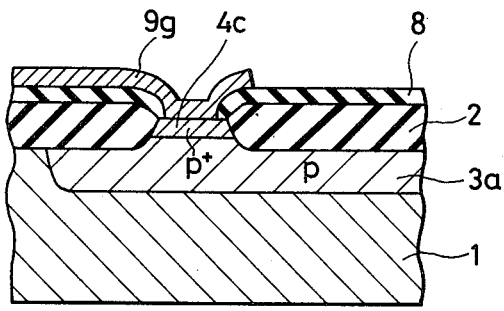

FIGS. 5A and 5B show sections of the MISFETs.

The major surface of an n-type single crystal silicon substrate 1 which is parallel to the (100) crystal plane is formed with a thick field oxide film 2 having a thickness of, e.g., about 1 μm by the known local oxidation technique. Those parts of the substrate 1 which are not covered with the field oxide film 2 are used as active regions for forming the circuit elements.

The p-channel MISFET $Q_4$ is constructed of $p^+$-type source region 4a and drain region 4b which are formed in the surface of the substrate 1, and a $p^+$-type polycrystalline silicon layer 7a which is formed on the surface of the substrate 1 through a gate insulating film 6a. The $p^+$-type polycrystalline silicon layer 7a forms the gate electrode of the MISFET $Q_4$.

In the surface of the substrate 1, there are formed p-type well regions 3a and 3b for forming the n-channel MISFETs $Q_1$ and $Q_2$.

The MISFET $Q_1$ is constructed of $n^+$-type source region 5a and drain region 5b which are formed in the surface of the p-type well region 3a, and a polycrystalline silicon layer 7b which is formed on the surface of the p-type well region 3a through a gate insulating film 6b. The polycrystalline silicon layer 7b has its central part $G_2$ made the p+-type. Although not especially restricted, the polycrystalline silicon layer 7b has both its end parts $G_1$ and $G_2$ made the n+-type.

The MISFET $Q_2$ is constructed of n+-type source region 5c and drain region 5d which are formed in the surface of the p-type well region 3b, and an n+-type polycrystalline silicon layer 7c which is formed on the surface of the p-type well region 3b through a gate insulating film 6c.

The surface of the p-type well region 3a is formed with a p+-type contact region 4c as shown in FIG. 5B.

An insulating film 8 made of, e. g., phosphosilicate glass is formed on the field oxide film 2 and the surfaces of the parts of the substrate 1 formed with the MISFETs. On the surface of the insulating film 8, there are formed wiring layers 9a to 9g made of, e. g., evaporated aluminum. The wiring layers 9a to 9g are held in ohmic contact with the various regions of the MISFETs. In order to enhance the gate - drain breakdown voltages of the respective MISFETs and also to prevent undesired impurities from being introduced into the polycrystalline silicon layers 7a to 7c, the surfaces of the polycrystalline silicon layers 7a to 7c are formed with thin oxide films by thermal oxidation before the insulating film 8 is formed. In the illustration of FIG. 5A, however, such thin oxide films are omitted in order to avoid the complication of the drawing.

The IC as shown in FIGS. 5A and 5B can be manufactured by the use of the CMOS IC production technology and without adding any special step of manufacture.

By way of example, after the p-type well regions 3a and 3b, the field oxide film 2 and the gate insulating films 6a to 6c have been formed, a polycrystalline silicon layer is formed on the whole area of the surface of the substrate 1 by the known CVD (chemical vapor deposition) process. By selectively etching this polycrystalline silicon layer, the polycrystalline silicon layers 7a to 7c are formed.

Subsequently, a first silicon oxide film to be used as an impurity introducing mask is formed on the surface of the substrate 1 by the CVD process. The selective etching is performed to remove those parts of the first silicon oxide film which overlie the parts to form the p-channel MISFETs therein, the part $G_2$ of the polycrystalline silicon layer 7b and the part to form the contact region 4c therein. Subsequently, a p-type impurity such as boron is introduced by the impurity diffusion process into the polycrystalline silicon layers and the surface parts of the substrate 1 which are not covered with the first silicon oxide film. Thus, the P+-type semiconductor regions 4a to 4c are formed. In addition, the entire polycrystalline silicon layer 7a and the central part $G_2$ of the polycrystalline silicon layer 7b are made the p+-type.

Next, the first silicon oxide film is removed, whereupon a second silicon oxide film to be used as an impurity introducing mask is formed on the substrate 1. The second silicon oxide film is removed in its parts which overlie the parts to form the source and drain regions of the MISFET $Q_1$ therein, the end parts $G_1$ and $G_3$ of the polycrystalline silicon layer 7b and the part to form the MISFET $Q_2$ therein.

Next, an n-type impurity such as phosphorus is introduced into the polycrystalline silicon layers and the surface parts of the p-type well regions 3a and 3b which are exposed. As a result, the n+-type semiconductor regions 5a to 5d are formed. In addition, the end parts $G_1$ and $G_3$ of the polycrystalline silicon layer 7b and the entire polycrystalline silicon layer 7c are made the n+-type. The end parts $G_1$ and $G_3$ of the polycrystalline silicon layer 7b have the n-type impurity introduced thereinto, respectively, in order that the positions of the end parts of the n+-type source and drain regions 5a and 5b of the MISFET $Q_1$ may be determined by the polycrystalline silicon layer 7b, in other words, that the regions 5a and 5b may be formed by the self-alignment technique. The widths of the end parts $G_1$ and $G_5$ are determined by a mask alignment precision.

The n-channel MISFET $Q_1$ has a threshold voltage $V_{th1}$ of comparatively great magnitude because the part $G_2$ of its gate electrode is made of the p+-type polycrystalline silicon layer. The n-channel MISFET $Q_2$ has a comparatively small threshold voltage $V_{th2}$ because its gate electrode is made of the n+-type polycrystalline silicon layer.

The p-type well regions 3a and 3b in which the channels of the respective MISFETs $Q_1$ and $Q_2$ are formed are simultaneously formed by the IC production technology, so that they contain the conductivity type-determining impurity at densities equal to each other. Since the gate insulating films 6b and 6c are simultaneously formed, they are made of the same material and to equal thicknesses. Since the channel regions of the MISFETs $Q_1$ and $Q_2$ have equal characteristics and the gate insulating films 6b and 6c are made of the same material and have the equal thicknesses, the difference between the threshold voltages $V_{th1}$ and $V_{th2}$ becomes equal to the difference between the Fermi level of p+-type polycrystalline silicon and that of n+-type polycrystalline silicon. The n+-type polycrystalline silicon which contains the conduotivity type-determining impurity at a high density of, e. g., $10^{18}$ atoms/cm$^3$ has the Fermi level close to the bottom of the conduction band thereof. Likewise, the p+-type polycrystalline silicon has the Fermi level close to the top of the valence band thereof. Therefore, the threshold voltage difference $(V_{th1} - V_{th2})$ becomes a value which is close to the band gap of silicon.

In FIG. 4, the MISFET $Q_1$ has the diode arrangement. That is, the MISFET $Q_1$ has its drain and gate connected in common. The drain of the MISFET $Q_1$ is connected to the gate of the MISFET $Q_2$ to be paired with the former MISFET. The MISFET $Q_2$ constructs a source follower circuit along with the MISFET $Q_3$. A bias current to flow between the drain and source of the MISFET $Q_2$ is determined by the MISFET $Q_3$. This MISFET $Q_3$ has its drain and gate connected in order that the aforementioned bias current may be determined by an output voltage $V_{ref}$ which is delivered from the source of the MISFET $Q_2$. That is, the MISFET $Q_3$ has the diode arrangement. In order to supply a bias current to the MISFET $Q_1$, a current mirror circuit $CM_1$ constructed of the p-channel MISFETs $Q_4$ and $Q_5$ is disposed. The current mirror circuit $CM_1$ constructs a constant current source. Owing to circuit connections as shown in the figure, the input bias current of the current mirror type constant current source is produced from the drain of the MISFET $Q_2$. Accordingly a bias current to flow through the MISFET $Q_1$ is in accurate proportion to the bias current flowing through the MISFET $Q_2$.

In FIG. 4, the p-channel MISFETs $Q_4$ and $Q_5$ have their respective substrate gates (that is, the n-type silicon substrate 1 as shown in FIG. 5A) connected to a power supply terminal $V_{DD}$ along with their respective sources. In the figure, however, wiring lines between the substrate gates of the MISFETs $Q_4$ and $Q_5$ and the power supply terminal are omitted in order to avoid the complication of the drawing. Similarly, the wiring lines of p-channel MISFETs to substrate gates are omitted from the circuit diagrams of the other embodiments to be described later.

The n-channel MISFETs $Q_1$ and $Q_3$ have their respective substrate gates connected, along with their respective sources, to a reference potential terminal GND which is held at a potential such as the ground potential of the circuitry.

In this embodiment, it is desirable that the threshold voltage difference ($V_{th1} - V_{th2}$) between the MISFETs $Q_1$ and $Q_2$ is not affected by any other factor than the difference between the Fermi levels of the p+-type polycrystalline silicon and the n+-type polycrystalline silicon. If the substrate gate of the MISFET $Q_2$ is connected to the reference potential terminal GND, a voltage equal to the output voltage $V_{ref}$ will be applied across the source and the substrate gate of the MISFET $Q_2$. As a result, the threshold voltage $V_{th2}$ will be increased by the substrate bias effect. The magnitude of the increment of the threshold voltage which is caused by the substrate bias effect is affected by the Fermi level of a semiconductor. In contrast, the threshold voltage $V_{th1}$ is not affected by the substrate bias effect because the source and the substrate gate of the MISFET $Q_1$ are held equipotential. Therefore, the threshold voltage difference ($V_{th1} - V_{th2}$) becomes a value smaller than the Fermi level difference.

In this embodiment, though not especially restricted, the MISFET $Q_2$ has its substrate gate connected to its source similarly to the pairing MISFET $Q_1$ in order to prevent the undesirable decrease of the threshold voltage difference ($V_{th1} - V_{th2}$).

Now, the electrical characteristics of the illustrated circuit will be described. Letting m denote a current multiplication factor in the current mirror circuit $CM_1$ constructed of the MISFETs $Q_4$ and $Q_5$ and $I_o$ denote the bias current of the MISFET $Q_2$, the bias current which is supplied to the drain of the MISFET $Q_1$ becomes ($m \times I_o$). Letting $\beta_o(W_1/L_1)$, $\Gamma_o(W_2/L_2)$ and $\Gamma_o(W_3/L_3)$ (where $\Gamma_o$ indicates a constant, W a channel width and L a channel length) denote the transconductances of the respective MISFETs $Q_1$, $Q_2$ and $Q_3$; letting $V_{th1}$ and $V_{th2}$ denote the threshold voltages of the respective MISFETs $Q_1$ and $Q_2$ as described before; and letting $V_{th3}$ denote the threshold voltage of the MISFET $Q_3$; the output voltage $V_{ref}$ becomes a value satisfying the following equation (1):

$$V_{ref} = (V_{th1} - V_{th2}) + \sqrt{\frac{2I_o}{\beta_o\left(\frac{W_1}{L_1}\right)}} \left\{ \sqrt{m} - \sqrt{\frac{\left(\frac{W_1}{L_1}\right)}{\left(\frac{W_2}{L_2}\right)}} \right\} \quad (1)$$

Here, the bias current $I_o$ becomes a value which is determined by the MISFET $Q_3$ and which fulfills Equation (2):

$$I_o = \tfrac{1}{2}\beta_o\left(\frac{W_3}{L_3}\right)(V_{ref} - V_{th3})^2 \quad (2)$$

From Equations (1) and (2), accordingly, the output voltage $V_{ref}$ is given by the following equation (3):

$$V_{ref} = \{(V_{th1} - V_{th2}) - A\, V_{th3}\}/(1 - A) \quad (3)$$

where the term A is a constant which is denoted by the following equation (4):

$$A = \sqrt{\left(\frac{W_3}{L_3}\right)/\left(\frac{W_1}{L_1}\right)} \left\{ \sqrt{m} - \sqrt{\left(\frac{W_1}{L_1}\right)/\left(\frac{W_2}{L_2}\right)} \right\} \quad (4)$$

As apparent from Equations (3) and (4), the output voltage $V_{ref}$ assumes a value determined by only the sizes and threshold voltages of the respective MISFETs, and it does not depend upon the supply voltage $V_{DD}$.

As seen from Equation (4), the value of the constant A is made null by setting the current multiplication factor m and the size ratio of the MISFETs $Q_1$ and $Q_2$ at proper values. By way of example, when the current multiplication factor m is made 1 (one) and the sizes of the MISFETs $Q_1$ and $Q_2$ are made equal to each other, the constant A becomes null. At this time, the output voltage $V_{ref}$ becomes equal to the threshold voltage difference ($V_{th1} - V_{th2}$), i.e., the Fermi level difference between the p+-type polycrystalline silicon and the n+-type polycrystalline silicon as seen from Equation (3).

However, care needs to be taken of the fact that the band gap of silicon has the temperature dependence as shown in FIG. 2 and the fact that the Fermi levels of the p-type and n-type silicon materials has the temperature dependences as shown in FIG. 3.

In case the gate electrodes of the MISFETs $Q_1$ and $Q_2$ are made of the polycrystalline silicon as described above, the threshold voltage difference ($V_{th1} - V_{th2}$) has some temperature characteristic in accordance with such temperature dependences of the Fermi levels of the polycrystalline silicon materials. By way of example, in case the polycrystalline silicon layers to form the gate electrodes of the MISFETs $Q_1$ and $Q_2$ were respectively diffused with boron and phosphorus at high densities substantially equal to saturation densities to the end of attaining a threshold voltage difference ($V_{th1} - V_{th2}$) of about 1.2 volt, the measured temperature coefficient of the threshold voltage ($V_{th1} - V_{th2}$) was about $-0.3 \sim -0.5$ mV/° C.

In this embodiment, the temperature dependence of the threshold voltage difference ($V_{th1} - V_{th2}$) and that of the threshold voltage $V_{th3}$ are noted.

When the right-hand side of Equation (3) is differentiated by the temperature T, the following equation (5) indicative of the temperature dependence of the output voltage $V_{ref}$ can be obtained:

$$\frac{\partial V_{ref}}{\partial T} = \left\{ \frac{\partial(V_{th1} - V_{th2})}{\partial T} - A\frac{\partial V_{th3}}{\partial T} \right\}/(1 - A) \quad (5)$$

In order to make the temperature dependence of the output voltage $V_{ref}$ null, the constant A may be set in consideration of the temperature dependence of the threshold voltage difference ($V_{th1}-V_{th2}$) and that of the threshold voltage $V_{th3}$ so as to make the numerator terms of the right-hand side of Equation (4) null. As apparent from Equation (4), the constant A is determined by the size ratios of the respective MISFETs and the current multiplication factor. As understood from FIGS. 2 and 5, the temperature characteristic curve of the threshold voltage difference ($V_{th1}-V_{th2}$) is somewhat convex. Although not illustrated, the temperature characteristic curve of the threshold voltage $V_{th3}$ of the MISFET $Q_3$ is somewhat convex likewise to that of the threshold voltage difference ($V_{th1}-V_{th2}$).

In the foregoing case of the circuit of FIG. 1, the temperature compensation voltage which is formed substantially by the MISFETs $Q_{14}'$ and $Q_{15}'$ with their operating currents unbalanced can correct the threshold voltage difference in only a comparatively narrow temperature range. As a result, the output voltage $V_{ref2}$ of the circuit of FIG. 1 crooks like the curve $L_1$ in FIG. 9 referred to before.

In contrast, in the case of the circuit of the embodiment in FIG. 4, the threshold voltage $V_{th3}$ has the temperature dependence similar to that of the threshold voltage difference ($V_{th1}-V_{th2}$), so that the temperature dependence of the threshold voltage difference ($V_{th1}-V_{th2}$) can be satisfactorily compensated over a wide temperature range.

Figure 9:
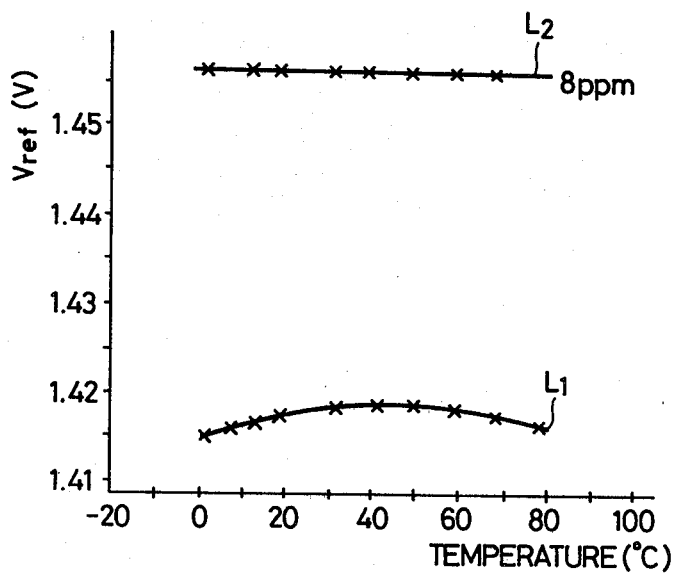
FIG. 9 is a graph showing the characteristic curves of the circuits in FIG. 1 and FIG. 4.

A curve $L_2$ in FIG. 9 indicates the measured result of the output voltage $V_{ref}$ at the time when the sizes of the MISFETs $Q_1$ to $Q_3$ were made equal to one another and when the current multiplication factor m of the current mirror circuit $CM_1$ constructed of the MISFETs $Q_4$ and $Q_5$ was made 1.5, that is, when the constant A was made 0.22.

As apparent from the figure, the temperature coefficient of the output voltage $V_{ref}$ is constant independent of temperatures. The temperature coefficient can be made substantially null by properly setting the constant A.

Figure 6:
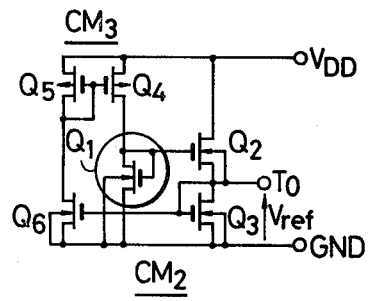
FIGS. 6, 7 and 8 are circuit diagrams each showing a reference voltage generator which is another embodiment of this invention.

FIG. 6 shows the circuit of another embodiment. In this circuit, a current mirror circuit $CM_2$ is constructed of MISFETs $Q_3$ and $Q_6$, while another current mirror circuit $CM_3$ is constructed of MISFETs $Q_5$ and $Q_4$. The drain current of the MISFET $Q_4$ is supplied to an n-channel MISFET $Q_1$ having a p+-type polycrystalline silicon electrode.

Since the MISFETs $Q_3$ and $Q_6$ are set at appropriate sizes, the current ratio between the MISFETs $Q_3$ and $Q_6$ is properly set. As a result, the current ratio between MISFETs $Q_1$ and $Q_2$ is properly set.

Since the current ratio of bias currents to flow through the MISFETs $Q_1$ and $Q_2$ and the sizes of the MISFETs $Q_1$, $Q_2$ and $Q_3$ are properly set, a desirable output voltage $V_{ref}$ which is stable against temperature fluctuations and power supply fluctuations can be obtained as in the circuit of FIG. 4.

In the circuit of FIG. 6, the current ratio of the bias currents to flow through the MISFETs $Q_1$ and $Q_2$ can also be properly set by appropriately setting the size ratio between the MISFETs $Q_5$ and $Q_4$ constituting the current mirror circuit $CM_3$, instead of changing the size ratio between the MISFETs $Q_3$ and $Q_6$.

In accordance with the circuit of FIG. 6, the drain of the MISFET $Q_2$ is maintained at a high voltage because it is connected to a power supply terminal $V_{DD}$. Accordingly, the circuit of FIG. 6 operates satisfactorily even with a supply voltage of a value smaller than the operating lower-limit voltage of the circuit in FIG. 4.

Figure 7:
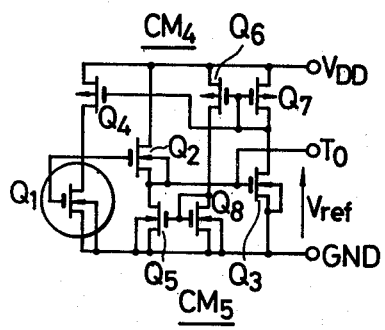

FIG. 7 shows the circuit of still another embodiment. In this circuit of FIG. 7, the drain current of a MISFET $Q_3$ is supplied to a current mirror circuit $CM_4$ which is constructed of MISFETs $Q_7$, $Q_6$ and $Q_4$.

One output current of the current mirror circuit $CM_4$ is supplied to a diode-connected MISFET $Q_1$, while the remaining output current is supplied to a current mirror circuit $CM_5$ which is constructed of MISFETs $Q_8$ and $Q_5$.

A bias current is caused to flow through a MISFET $Q_2$ by the current mirror circuit $CM_5$.

The MISFETs $Q_1$, $Q_2$ and $Q_3$ are made MISFETs having structures similar to those of the MISFETs $Q_1$, $Q_2$ and $Q_3$ in FIGS. 4 and 6.

Since the MISFETs $Q_1$, $Q_2$ and $Q_3$ are connected as shown in FIG. 7, a constant voltage $V_{ref}$ can be derived from the gate of the MISFET $Q_3$.

The bias currents to flow through the MISFETs $Q_1$ and $Q_2$ are set at an appropriate ratio by altering the current multiplication factor of at least one of the current mirror circuits $CM_4$ and $CM_5$.

The circuit of the embodiment in FIG. 7 has the merit that its output voltage $V_{ref}$ is difficult to be affected by a fluctuation in a supply voltage as described below.

The source - drain voltage of the MISFET $Q_4$ is varied due to the fluctuation of the supply voltage. When the source - drain voltage has been varied in this manner, the drain current of the MISFET $Q_4$ has its magnitude varied by the known channel length modulation effect. As a result, the magnitude of the bias current of the MISFET $Q_1$ is varied.

In this embodiment, however, conveniently the drain current of the MISFET $Q_6$ is varied simultaneously with the drain current of the MISFET $Q_4$ by the channel length modulation effect. As a result, the ratio between the drain current of the MISFET $Q_4$ and that of the MISFET $Q_6$ is made a substantially constant value corresponding to the size ratio between these MISFETs $Q_4$ and $Q_6$, irrespective of the fluctuation of the supply voltage. The MISFET $Q_5$ constituting the current mirror circuit $CM_5$ has its drain - source voltage held constant by the MISFET $Q_2$. Therefore, the current multiplication factor of the current mirror circuit $CM_5$ is maintained at a constant value irrespective of the fluctuation of the supply voltage.

As a result, the ratio between the bias currents to flow through the MISFETs $Q_1$ and $Q_2$ is maintained at a substantially constant value irrespective of the fluctuation of the supply voltage. Since, in this manner, the ratio of the bias currents of the two MISFETs $Q_1$ and $Q_2$ is maintained at the good value, the variation which is imposed on the output voltage $V_{ref}$ at the fluctuation of the supply voltage becomes sufficiently small.

Figure 8:
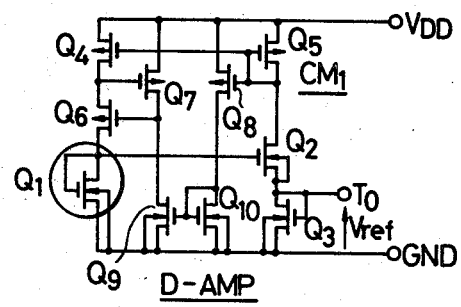

FIG. 8 shows the circuit of another embodiment of this invention. In accordance with the circuit of this embodiment in FIG. 8, the supply voltage dependence of an output voltage $V_{ref}$ is improved more satisfactorily. In a MISFET which is operated in its saturation region, even when a constant bias voltage is applied across the gate and source thereof, the source - drain current thereof is changed by the known channel length modulation effect as above described due to a change in the source - drain voltage thereof.

In the case of the circuit as shown in FIG. 4, one MISFET $Q_5$ constituting the current mirror circuit $CM_1$ has its gate and drain connected in common and therefore has its source - drain voltage maintained at a value substantially equal to its threshold voltage. Accordingly, the source - drain voltage of the MISFET $Q_5$ is maintained at a substantially constant value irrespective of the fluctuation of the supply voltage $V_{DD}$. In contrast, the source - drain voltage of the diode-connected MISFET $Q_1$ is made a substantially constant value, so that the source - drain voltage of the other MISFET $Q_4$ constituting the current mirror circuit $CM_1$ varies in accordance with the fluctuation of the supply voltage $V_{DD}$. The drain current of the MISFET $Q_4$ is accordingly varied comparatively greatly in accordance with the fluctuation of the supply voltage $V_{DD}$. Since the drain current of the MISFET $Q_4$ is changed, the current multiplication factor m of the current mirror circuit $CM_1$ is changed in accordance with the fluctuation of the supply voltage $V_{DD}$. For this reason, the voltage $V_{ref}$ which is delivered from the circuit shown in FIG. 4 comes to have some supply voltage dependence.

In the circuit shown in FIG. 8, a current mirror circuit $CM_1$ is constructed of p-channel MISFETs $Q_5$ and $Q_4$. In addition, a differential amplifier D-AMP is constructed of p-channel MISFETs $Q_7$ and $Q_8$ for amplification and n-channel MISFETs $Q_9$ and $Q_{10}$ in the current mirror connection. A p-channel MISFET $Q_6$ is interposed between the drain of the output MISFET $Q_4$ in the current mirror circuit $CM_1$ and the gate and drain of a diode-connected MISFET $Q_1$. The gate of the MISFET $Q_6$ is supplied with the output of the differential amplifier D-AMP.

Owing to illustrated connections, the drain voltages of the MISFETs $Q_4$ and $Q_5$ are supplied to the differential amplifier D-AMP. The output of the differential amplifier D-AMP is negatively fed back to the gate of the MISFET $Q_6$. As the result of the negative feedback operation, the drain voltage of the MISFET $Q_4$ becomes a value equal to that of the MISFET $Q_5$.

As the result of the source - drain voltages of the MISFETs $Q_4$ and $Q_5$ equalized to each other, the relative variations of the source - drain currents of the MISFETs $Q_4$ and $Q_5$ as based on the respective channel length modulation effects thereof become equal to each other. As a result, the current multiplication factor m of the current mirror circuit $CM_1$ is held constant irrespective of the fluctuation of the supply voltage $V_{DD}$.

Since the multiplication factor m is held constant, a voltage $V_{ref}$ which is delivered from the circuit shown in FIG. 8 comes to have substantially no supply voltage dependence.

Figures 10A, 10B, 10C:
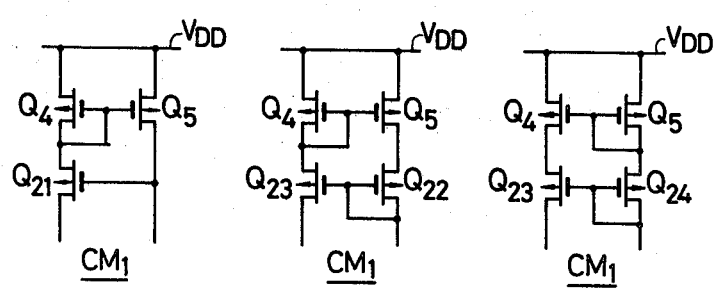
FIGS. 10A, 10B and 10C are circuit diagrams each showing a current mirror circuit.

Each of FIGS. 10A to 10C shows the arrangement of a current mirror circuit $CM_1$ whose current multiplication factor m fluctuates little due to the channel length modulation effect.

Each of the circuits in FIGS. 10A to 10C can be replaced with the current mirror circuit $CM_1$ shown in FIG. 4, or with the current mirror circuit $CM_1$ or the differential amplifier D-AMP and the MISFET $Q_6$ shown in FIG. 8. The circuit shown in FIG. 10A is constructed of the smallest number of MISFETs. When, in the circuit of FIG. 10B or FIG. 10C, at least MISFETs $Q_{23}$ and $Q_{24}$ are endowed with equal threshold voltages, the source - drain voltages of MISFETs $Q_4$ and $Q_5$ can be substantially equalized to each other. In order to equalize the drain voltages of the MISFETs $Q_4$ and $Q_5$ irrespective of the current multiplication factor m, the ratio between the sizes of the MISFETs $Q_{23}$ and $Q_{24}$ may be equalized to the ratio between the sizes of the MISFETs $Q_4$ and $Q_5$.

This invention can be extensively utilized as the reference voltage generator.

Figure 11:
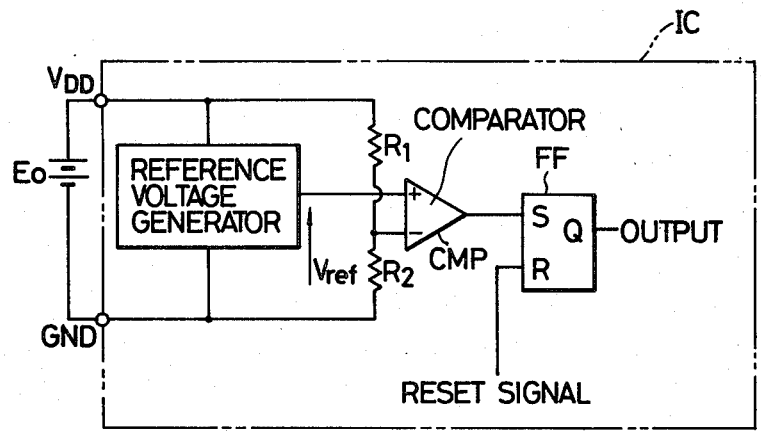
FIG. 11 is a circuit diagram of a battery checker.

For example, it is suited to form the reference voltage of a battery checker as shown in FIG. 11 which gives the alarm of decrease in the voltage of a battery and which is utilized in an electronic desk calculator etc. The reason is that it includes a small number of elements used and can be readily put into the form of a 1-chip MIS IC.

This circuit operates as follows. First, a reset signal generator not shown is disposed, and a reset signal is produced therefrom at the time of closure of a power supply. A flip-flop circuit FF is accordingly reset by the reset signal supplied to its reset terminal at the closure of the power supply. A divided voltage $(R_2 E_o)/(R_1+R_2)$ which is delivered from a voltage divider constructed of resistance elements $R_1$ and $R_2$ is changed with a battery voltage $E_o$. This divided voltage and the reference voltage delivered from the reference voltage generator are compared by a comparator CMP.

In case the battery voltage $E_o$ is greater than a predetermined value, the output of the comparator CMP is made a low level which is substantially equal to the ground potential.

In case the battery voltage $E_o$ has become lower than the predetermined value, the output of the comparator CMP is responsively made a high level which is substantially equal to the level of the battery voltage $E_o$.

Figure 12:
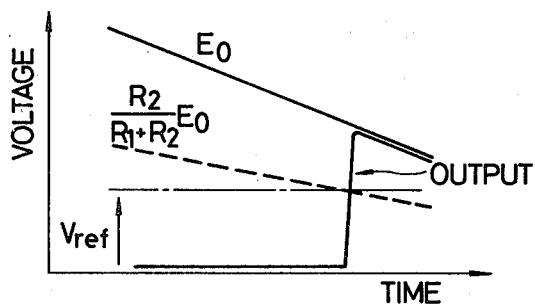
FIG. 12 is an operating waveform diagram of the circuit in FIG. 11.

The flip-flop FF is accordingly brought into its set status. A display device, not shown, is driven by the set output of the flip-flop FF. That is, the display or the like of the alarm of a consumed battery is effected. Operating waveforms are shown in FIG. 12.

Figure 13:
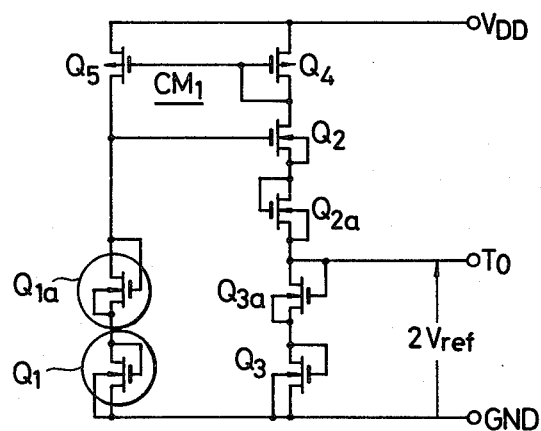
FIG. 13 is a circuit diagram of a reference voltage generator which is still another embodiment.

This invention is not restricted to the foregoing embodiments. In place of the construction wherein to the end of making the threshold voltages of the respective MISFETs unequal, the conductivity types of the polycrystalline silicon layers as the gate electrodes are made different as described before, there can be adopted a construction wherein various factors influential on the threshold voltages are made different. For example, in case of utilizing the difference between the work functions of gate electrodes, the gate electrode of one of a pair of MISFETs can be made of polycrystalline silicon, and that of the other MISFET can be made of aluminum, molybdenum or the like. It is also allowed to change the density of a conductivity type-determining impurity in a part to be used as the channel region of one MISFET, with the ion implantation technique or the like. The MISFETs, such as those $Q_3$ shown in FIGS. 4, 6 and 8, which are diode-connected in order to determine bias current levels may well have the n-channel type changed into the p-channel type, if necessary. In case a comparatively high reference voltage is required, the circuit as shown in FIG. 4, for example, may be combined with a linear amplifier having an appropriate gain. A circuit of an arrangement as shown in FIG. 13 may be employed as well.

What is claimed is:

1. A reference voltage generator comprising:
    an output terminal;
    a bias circuit including a first MISFET which is supplied across its gate and source with a voltage between said output terminal and a reference point and which produces a drain - source current of a level corresponding to the voltage supplied across said gate and source; said bias circuit generating first and second bias currents which have levels proportional to the drain - source current of said first MISFET;

a second MISFET which has a drain - source path coupled between a first node and said reference point, and a gate coupled to a drain thereof; the drain - source path being supplied with said first bias current; and a third MISFET which has a gate coupled to said first node, a source coupled to said output terminal, and a drain, whose threshold voltage is made a value smaller than that of said second MISFET and whose drain - source path is supplied with said second bias current;

whereby a voltage which corresponds to a difference between a threshold voltage of said first MISFET and that of said third MISFET is supplied from said third MISFET to said output terminal.

2. A reference voltage generator according to claim 1, wherein a potential difference which is applied across the substrate gate and source of said third MISFET is equalized to a potential difference which is applied across the substrate gate and source of said second MISFET.

3. A reference voltage generator according to claim 1, wherein said second MISFET and said third MISFET have channel lengths and channel widths equal to each other, and said first bias current has a value greater than said second bias current.

4. A reference voltage generator according to claim 1, wherein said first MISFET has its drain - source path coupled between said output terminal and said reference point, and has its gate coupled to its drain.

5. A reference voltage generator according to claim 4, wherein said bias circuit includes a current mirror circuit which is supplied with a drain current of said third MISFET thereby to generate said first bias current.

6. A reference voltage generator according to claim 5, wherein said current mirror circuit is constructed of a fourth MISFET whose gate and drain are coupled and which has a conductivity type opposite to that of said third MISFET, and a fifth MISFET whose gate is coupled to the gate of said fourth MISFET, whose source is coupled to a source of said fourth MISFET and which has the same conductivity type as that of said fourth MISFET.

7. A reference voltage generator according to claim 6, further including an additional circuit which makes a source - drain voltage of said fifth MISFET substantially equal to that of said fourth MISFET.

8. A reference voltage generator according to claim 7, wherein said additional circuit is constructed of a sixth MISFET which has a source - drain path connected between the drain of said fifth MISFET and that of said second MISFET and which has the same conductivity type as that of said fifth MISFET, and a differential amplifier which has a non-inverting input terminal that is supplied with a drain voltage of said fourth MISFET, an inverting input terminal that is supplied with a drain voltage of said fifth MISFET and an output terminal that delivers a voltage to be supplied to a gate of said sixth MISFET.

9. A reference voltage generator according to claim 4, wherein said bias circuit includes a fourth MISFET whose gate and source are respectively connected to the gate and source of said first MISFET in common, and a current mirror circuit which is supplied with a drain current of said fourth MISFET thereby to generate said first bias current.

10. A reference voltage generator according to claim 1, wherein said bias circuit includes a current mirror circuit which is supplied with a drain current of said first MISFET thereby to generate said first and second bias currents.

11. A reference voltage generator according to claim 10, wherein said current mirror circuit is constructed of a fourth MISFET which has a gate and a drain connected to the drain of said first MISFET in common and which has a conductivity type opposite to that of said first MISFET, and fifth and sixth MISFETs whose gates and sources are respectively connected to the gate and source of said fourth MISFET and which have the same conductivity type as that of said fourth MISFET, whereby said first bias current is delivered from the drain of said sixth MISFET, and said second bias current is delivered from the drain of said fifth MISFET.

12. A reference voltage generator according to claim 11, wherein said current mirror circuit further includes a seventh MISFET which has a gate and a drain connected to the drain of said fifth MISFET in common and which has the same conductivity type as that of said first MISFET, and an eighth MISFET which has a gate and a source respectively connected to the gate and a source of said seventh MISFET in common and which has the same conductivity type as that of said first MISFET, whereby said second bias current is generated at a drain of said eighth MISFET.

13. A reference voltage generator according to claim 1, wherein said first to third MISFETs are formed on a semiconductor substrate which constructs a CMOS IC.

14. A reference voltage generator according to claim 12, wherein the gate of said second MISFET and that of said third MISFET are made of materials having work functions different from each other.

15. A reference voltage generator according to claim 14, wherein the gate of said second MISFET and that of said third MISFET are made of silicon.

16. A reference voltage generator according to claim 15, wherein said second and third MISFETs are of the n-channel type.

17. A reference voltage generator according to claim 16, wherein the gate of said second MISFET is of the p-type, while the gate of said third MISFET is of the n-type.

18. A reference voltage generator according to claim 17, wherein said second and third MISFETs are formed on p-type well regions which are formed in a surface of said semiconductor substrate electrically independently of each other.

* * * * *